(12) United States Patent
Sakai

(10) Patent No.: US 7,760,784 B2
(45) Date of Patent: Jul. 20, 2010

(54) LASER DIODE HAVING NANO PATTERNS AND METHOD OF FABRICATING THE SAME

(75) Inventor: Shiro Sakai, Tokushima (JP)

(73) Assignees: Seoul Opto Device Co., Ltd., Ansan-si (KR); The University of Tokushima, Tokushima (JP)

(*) Notice: Subject to any disclaimer, the term of this patent is extended or adjusted under 35 U.S.C. 154(b) by 2 days.

(21) Appl. No.: 12/185,995

(22) Filed: Aug. 5, 2008

(65) Prior Publication Data

US 2009/0092165 A1     Apr. 9, 2009

(30) Foreign Application Priority Data

Oct. 9, 2007     (KR) ...................... 10-2007-0101262

(51) Int. Cl.
    *H01S 5/00*        (2006.01)
    *H01S 3/08*        (2006.01)

(52) U.S. Cl. .................... 372/45.01; 372/43.01; 372/92

(58) Field of Classification Search .............. 372/43.01, 372/45.01, 92, 98–99; 977/720
See application file for complete search history.

(56) References Cited

U.S. PATENT DOCUMENTS

| | | | |
|---|---|---|---|
| 5,684,817 A | | 11/1997 | Houdre |
| 6,674,778 B1 * | | 1/2004 | Lin et al. ................. 372/46.01 |
| 7,009,216 B2 * | | 3/2006 | Otsuka et al. ................. 257/98 |
| 7,254,154 B2 * | | 8/2007 | Thedrez ....................... 372/96 |
| 7,298,949 B2 * | | 11/2007 | Gothoskar et al. .......... 385/130 |
| 7,436,873 B2 * | | 10/2008 | Sugitatsu et al. .............. 372/98 |
| 7,499,480 B2 * | | 3/2009 | Nagatomo ............. 372/50.124 |
| 2002/0118941 A1 * | | 8/2002 | Notomi et al. .............. 385/129 |
| 2004/0135155 A1 | | 7/2004 | Otsuka |
| 2004/0206971 A1 | | 10/2004 | Erchak |
| 2005/0232329 A1 | | 10/2005 | Thedrez |
| 2007/0036189 A1 * | | 2/2007 | Hori et al. ................ 372/50.11 |

FOREIGN PATENT DOCUMENTS

| | | |
|---|---|---|
| JP | 2005-129604 | 5/2005 |
| KR | 100421147 | 2/2004 |

OTHER PUBLICATIONS

Kennedy et al., "InP-Based Quantum Cascade Lateral Grating Distributed Feedback Laser", Extended Abstracts of the 2006 International Conference on Solid State Devices and Materials, Yokohama, 2006, B-3-6, p. 262-263.
European Search Report dated Aug. 19, 2009.

* cited by examiner

*Primary Examiner*—Minsun Harvey
*Assistant Examiner*—Phillip Nguyen
(74) *Attorney, Agent, or Firm*—H.C. Park & Associates, PLC

(57) ABSTRACT

A laser diode having nano patterns is disposed on a substrate. A first conductive-type clad layer is disposed on the substrate, and a second conductive-type clad layer is disposed on the first conductive-type clad layer. An active layer is interposed between the first conductive-type clad layer and the second conductive-type clad layer. Column-shaped nano patterns are arranged at a surface of the second conductive-type clad layer to form a laser diode such as a distributed feedback laser diode.

19 Claims, 5 Drawing Sheets

LASER DIODE HAVING NANO PATTERNS AND METHOD OF FABRICATING THE SAME

CROSS REFERENCE TO RELATED APPLICATION

This application claims priority from and the benefit of Korean Patent Application No. 10-2007-0101262, filed on Oct. 9, 2007, which is hereby incorporated by reference for all purposes as if fully set forth herein.

BACKGROUND OF THE INVENTION

1. Field of the Invention

The present invention relates to a laser diode and a method of fabricating the same, and more particularly, to a laser diode having column-shaped nano patterns and a method of fabricating the laser diode.

2. Discussion of the Background

In optical communications or other applications in which a wavelength range is extremely limited, a distributed feedback (DFB) laser, distributed Bragg reflector (DBR) laser, or Bragg reflector (BR) laser may be used. A conventional DFB laser diode has a layer having a periodically concavo-convex portion, e.g., a concavo-convex portion with a stripe shape, formed along an active layer and reflects light on the layer, thereby implementing a single mode laser.

Such a laser diode may be fabricated by stopping crystal growth of a semiconductor layer, forming a concavo-convex portion thereon, and then restarting the semiconductor layer growth again. However, the semiconductor layers cannot be continuously grown, and therefore, the process of growing semiconductor layers may be complicated.

Alternatively, a laser diode may be fabricated by forming a concavo-convex portion on a surface of a semiconductor layer which has been completely grown. One technique for forming a concavo-convex portion on a surface of an InP-based semiconductor layer has been disclosed by Kennedy et al. (see Extended Abstracts of the 2006 International Conference on Solid State Devices and Materials, 2006, B-3-6, p 262-263).

Studies on a DFB (or, DBR or DR) laser diode have been conducted. Particularly, studies on a single mode DFB laser having a wavelength of about 400 nm have been conducted.

SUMMARY OF THE INVENTION

This invention provides a laser diode with a new structure, particularly a laser diode having new nano patterns, and a method of fabricating the laser diode.

This invention also provides a laser diode in which a wavelength of a laser can be changed depending on a direction of a cleavage plane, and a method of fabricating the laser diode.

Additional features of the invention will be set forth in the description which follows, and in part will be apparent from the description, or may be learned by practice of the invention.

The present invention discloses a laser diode having nano patterns. The laser diode has a substrate. A first conductive-type clad layer is disposed over the substrate, and a second conductive-type clad layer is disposed over the first conductive-type clad layer. An active layer is interposed between the first and second conductive-type clad layers. Column-shaped nano patterns are periodically arranged at a surface of the second conductive-type clad layer.

Here, the column-shaped "nano patterns" means column-shaped patterns, each of which has a cross sectional area less than 1 $\mu m^2$. Such nano patterns are arranged at the surface of the second conductive-type clad layer, thereby implementing a single mode laser such as a distributed feedback laser diode. The terms "first conductive-type" and "second conductive-type" mean conductive types relative to each other, and may be n-type and p-type or p-type and n-type, respectively.

The nano patterns may be formed by partially etching the second conductive-type clad layer. For example, the nano patterns may be formed by forming a second conductive-type contact layer on the second conductive-type clad layer and partially etching the second conductive-type clad layer through the second conductive-type contact layer. Thus, the nano patterns are formed by patterning the semiconductor layers after the crystal growth of semiconductor layers is completed. Accordingly, the semiconductor layers can be continuously grown.

Meanwhile, the nano patterns may have a vertical cross section formed in the shape of a polygon or circle. Particularly, the respective nano patterns may be formed in a circular-column shape having a diameter.

In addition, the nano patterns may be spaced apart from one another at the same interval as the diameter. Therefore, the nano patterns are arranged in a hive shape, and three adjacent nano patterns define a regular triangle. The respective nano patterns may have a diameter of 100 nm to 250 nm.

Meanwhile, the laser diode may have cleavage mirrors formed at both opposite side surfaces of the laser diode. The cleavage mirrors may be formed at both side surfaces of the semiconductor layers along cleavage planes of the substrate. The cleavage planes of the substrate, i.e., the cleavage mirrors may be parallel with any one side of a regular triangle defined by three adjacent nano patterns. The cleavage mirrors may make an angle of intersection with all sides of a regular triangle defined by three adjacent nano patterns. The wavelength of a radiated laser can be controlled by adjusting the angle made by one side of the regular triangle and the cleavage mirror.

In some embodiments of the present invention, the respective nano patterns may be formed in a protruding column shape, and a second conductive-type contact layer may be provided on an upper side of the respective nano patterns. Alternatively, the laser diode may further include a second conductive-type contact layer formed on the second conductive-type clad layer, and the nano patterns may be recessed portions, which are formed in the second conductive-type clad layer by passing through the second conductive-type contact layer. The recessed portion may have a column shape.

In some embodiments of the present invention, the laser diode may be a distributed feedback laser diode, a distributed Bragg reflector laser diode or a Bragg reflector laser diode.

The present invention also discloses a method of fabricating a laser diode, which includes forming semiconductor layers with a laminated structure having a first conductive-type clad layer, an active layer, and a second conductive-type clad layer on a substrate. The method also includes forming column-shaped nano patterns spaced apart from one another by partially etching the second conductive-type clad layer.

The nano patterns may be formed using a nano lithography technique, particularly a nano imprint technique. Since the nano patterns can be formed throughout the entire surface of a large-sized substrate such as a two-inch substrate, the nano imprint technique is suitable for mass-production of laser diodes.

Meanwhile, the method may further include forming a second conductive-type contact layer on top of the second conductive-type clad layer before partially etching the second conductive-type clad layer.

In addition, a mesa may be formed by etching the second conductive-type clad layer, the active layer and the first conductive-type clad layer to expose a first conductive-type contact layer for forming a first electrode. A ridge may be formed by partially etching the second conductive-type clad layer along both sides of a region where the nano patterns will be positioned. The refractive index of the regions, where the second conductive-type clad layer is partially etched, is decreased, and the ridge has a relatively large refractive index, whereby light is concentrated on the ridge.

Both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
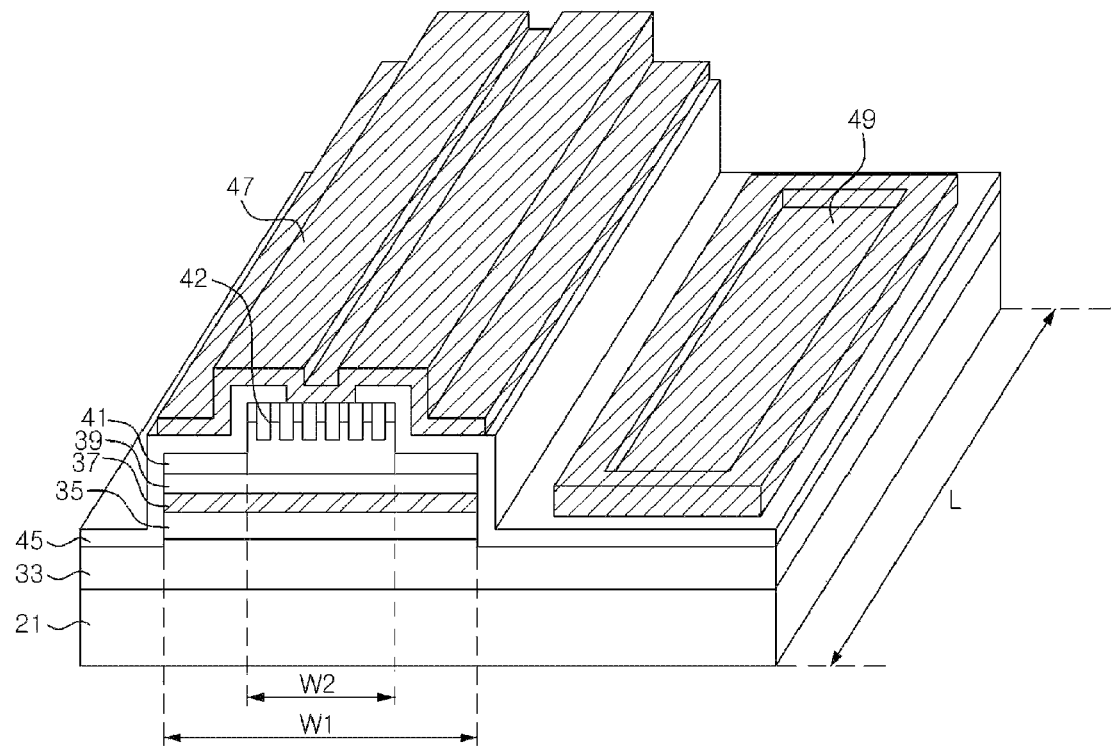
FIG. 1 is a schematic perspective view of a laser diode according to an embodiment of the present invention.

Hereinafter, embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
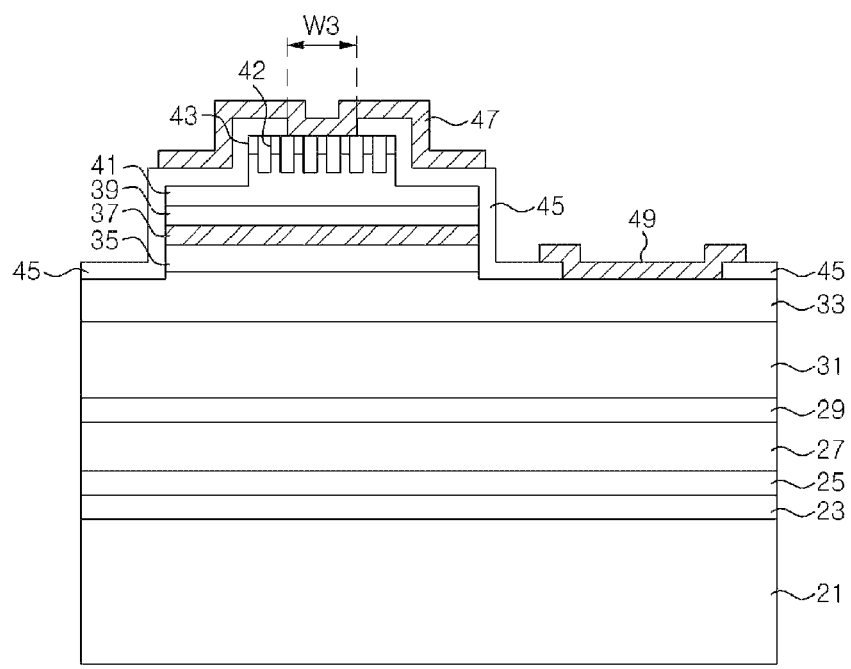
FIG. 2 is a sectional view of the laser diode shown in FIG. 1 according to the embodiment of the present invention.

FIG. 1 is a schematic perspective view of a laser diode according to an embodiment of the present invention, and FIG. 2 is a sectional view of the laser diode shown in FIG. 1.

Referring to FIG. 1 and FIG. 2, the laser diode includes a substrate 21, a first conductive-type clad layer 35, an active layer 37, a second conductive-type clad layer 41, and nano patterns 42 located at a surface of the second conductive-type clad layer 41. In addition, a first conductive-type contact layer 33 may be interposed between the substrate 21 and the first conductive-type clad layer 35, and a second conductive-type contact layer 43 may be disposed on the second conductive-type clad layer 41.

The substrate 21 is not particularly limited, and may be a substrate suitable for growing semiconductor layers. The substrate 21 may be a GaN, SiC or sapphire substrate. In this embodiment, it will be described that the substrate 21 is a sapphire substrate.

The first and second conductive-type clad layers 35 and 41 are disposed above the substrate 21, and the active layer 37 is interposed between the first and second conductive-type clad layers 35 and 41. In addition, a carrier blocking layer 39 may be interposed between the second conductive-type clad layer 41 and the active layer 37.

In this embodiment, the first conductive-type clad layer 35 may, for example, have a single-layered structure of n-type AlGaN or a multi-layered structure in which n-type AlGaN and n-type GaN are repeatedly formed. Particularly, the first conductive-type clad layer 35 may have a superlattice layer of n-type AlGaN/GaN. The second conductive-type clad layer 41 may have a single-layered structure of p-type AlGaN or a multi-layered structure in which AlGaN and GaN are repeatedly formed. Particularly, the second conductive-type clad layer 41 may have a superlattice structure of p-type AlGaN/GaN. The active layer 37 may have a single or multiple quantum well structure. For example, the active layer 37 may have a multiple quantum well structure in which InGaN well layers and GaN barrier layers are alternately laminated. In addition, the carrier blocking layer 39 may be formed of p-type AlGaN. The carrier blocking layer 39 has a bandgap relatively wider than the second conductive-type clad layer 41, and therefore, the composition ratio of Al in the carrier blocking layer 39 is relatively greater than that of Al in the second conductive-type clad layer 41. In addition, the first conductive-type contact layer 33 may be formed of n-type GaN, and the second conductive-type contact layer 43 may be formed of p-type GaN.

Meanwhile, the nano patterns 42 positioned at the surface of the second conductive-type clad layer 41 may have a column shape, e.g., a polygonal or circular column shape, particularly a circular column shape. Such a circular column shape has a diameter. The nano patterns 42 are periodically arranged on the surface of the second conductive-type clad layer 41.

Particularly, the circular-column-shaped nano patterns 42 may be arranged at the same interval as the diameter of the nano patterns 42, so that three adjacent nano patterns 42 define a regular triangle.

The periodic interval between the nano patterns 42 may be obtained by wavelength $\lambda$/p/refractive index n (e.g., $\lambda$=400 nm, p=0.5, 1, 2, . . . , and n=2.6). Here, the wavelength $\lambda$ is a wavelength of a required laser, and p denotes that the periodic interval between the nano patterns 42 is half of, one time, two times, or the like, of the wavelength. If p=0.5 and 1, a periodic interval between the nano patterns 42 may be 308 nm and 154 nm, respectively.

The substrate 21 may have cleavage planes formed on both side surfaces opposite to each other in a direction of length L of the substrate 21. Each cleavage plane is parallel with a cleavage mirror, which is formed by cutting the clad layers 35 and 41 and the active layer 37 along the cleavage plane. The wavelength radiated from the laser diode can be adjusted depending on an angle made by the cleavage plane, i.e., the cleavage mirror, and the arrangement direction of the nano patterns 42. For example, the cleavage mirrors may be parallel with any one side of a regular triangle defined by adjacent nano patterns 42, or make an angle of intersection with all sides of the regular triangle.

The nano patterns 42 may be formed by etching the second conductive-type contact layer 43 and the second conductive-type clad layer 41 together. For example, the nano patterns 42 may be protruding columns including the second conductive-type contact layer 43 and the second conductive-type clad layer 41, or recessed portions surrounded by the second conductive-type contact layer 43 and the second conductive-type clad layer 41.

The nano patterns 42 may be formed at a surface of a ridge of the second conductive-type clad layer 41, which is formed along the direction of the length L, and the second conductive-type clad layer 41 on both sides of the ridge may have a thickness that is relatively smaller than the thickness of the second conductive-type clad layer 41 along the ridge. The shape of the ridge causes a refractive index difference, thereby concentrating light generated in the active layer on the ridge having a relatively large refractive index. In FIG. 1, the width of the ridge is designated by W2. The first conductive-type clad layer 35, the active layer 37 and the second conductive-type clad layer 41 may form a mesa as shown in FIG. 1 and FIG. 2. In FIG. 1, the width of the mesa is designated by W1.

The first conductive-type contact layer 33 may be exposed at one or both sides of the mesa. A first electrode 49 may be formed on the exposed first conductive-type contact layer 33, and a second electrode 47 may be formed on the nano patterns 42. An insulating layer 45 may cover the first conductive-type contact layer 33, the mesa and the ridge. The insulating layer 45 has openings that expose the first and second conductive-type contact layers 33 and 43, and the first and second electrodes 49 and 47 may be in electric contact with the contact layers 33 and 43 through the openings, respectively. In FIG. 2, the region at which the second electrode 47 is in contact with the second conductive-type contact layer 43, i.e., the opening that exposes the second conductive-type contact layer 43 has a width designated by W3.

Buffer layers 23 and 25 and undoped GaN layers 27 and 31 may be interposed between the first conductive-type contact layer 33 and the substrate 21. A defect prevention layer 29 may be interposed between the undoped GaN layers 27 and 31. The buffer layer 23 may be formed of SiN, and the buffer layer 25 may be formed of AlN, GaN or AlGaN. The buffer layers 23 and 25 and the undoped GaN layers 27 and 31 are employed to reduce defects produced in the semiconductors formed on top thereof.

Although it has been described in this embodiment that the first conductive-type contact layer 33 is a different layer than the first conductive-type clad layer 35, the first conductive-type contact layer 33 may be the same material layer as the first conductive-type clad layer 35. That is, the first conductive-type contact layer 33 may be a portion of the first conductive-type clad layer 35.

According to this embodiment, the column-shaped nano patterns 42 are periodically arranged at the surface of the second conductive-type clad layer 41, particularly at the surface of the ridge thereof, thereby providing a DFB laser (or DBR or BR laser) diode. Particularly, a single mode laser in a range of about 400 nm can be implemented using AlInGaN-based compound semiconductor layers.

FIG. 3, FIG. 4, FIG. 5, and FIG. 6 are sectional views illustrating a method of fabricating a laser diode according to an embodiment of the present invention.

Figure 3:
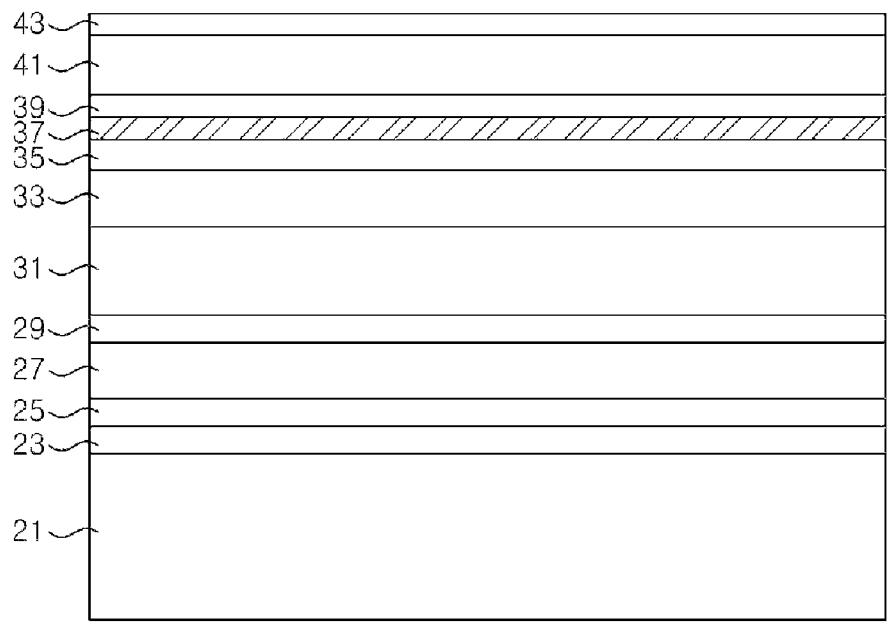
FIG. 3, FIG. 4, FIG. 5, and FIG. 6 are sectional views illustrating a method of fabricating a laser diode according to an embodiment of the present invention.

Referring to FIG. 3, a first buffer layer 23 and a second buffer layer 25 are formed on a substrate 21. The substrate 21 may be, for example, a GaN, SiC or sapphire substrate. The first buffer layer 23 may be formed of SiN using $SiH_4$ and ammonia as a source gas. In addition, the first buffer layer 23 may be formed of GaN, AlN or AlGaN by a metal organic chemical vapor deposition (MOCVD) technique. The first buffer layer 23 is a layer for reducing defects, which may be omitted.

A first undoped layer 27, a defect prevention layer 29, and a second undoped layer 31 are sequentially formed on the second buffer layer 25. The first and second undoped layers 27 and 31 may be formed of undoped GaN. In this embodiment, the layers 27 and 31 are formed without artificial doping. However, they may be formed of doped GaN, and may have a multiple layer structure, e.g., a superlattice structure. The defect prevention layer 29 may be formed of SiN and is used to prevent a defect such as dislocation from transferring from a first undoped layer 27 to a layer formed on the first undoped layer 27. Such a defect prevention layer 29 may be omitted.

A first conductive-type contact layer 33 is formed on the second undoped layer 31. The first conductive-type contact layer 33 may be formed of, for example, n-type GaN. If the substrate 21 is non-conductive like sapphire, the first conductive-type contact layer 33 may contact a first electrode 49 as shown in FIG. 1.

A first conductive-type clad layer 35, an active layer 37, a carrier blocking layer 39, and a second conductive-type clad layer 41 are formed on the first conductive-type contact layer 33. The first conductive-type clad layer 35 may have, for example, a single-layered structure of n-type AlGaN, a multi-layered structure of n-type AlGaN/GaN, or a superlattice structure of n-type AlGaN/GaN. The second conductive-type clad layer 41 may have, for example, a single-layered structure of p-type AlGaN, a multi-layered structure of p-type AlGaN/GaN, or a superlattice structure of p-type AlGaN/GaN. The active layer 37 may have, for example, a single quantum well structure of InGaN or a multiple quantum well structure of InGaN/GaN. The carrier blocking layer 39 is formed of a material having a bandgap relatively wider than the second conductive-type clad layer 41. The carrier blocking layer 39 may be formed of the same conductive-type material as the second conductive-type clad layer 41, e.g., AlGaN.

A second conductive-type contact layer 43 is formed on the second conductive-type clad layer 41. The second conductive-type contact layer 43 may be formed of, for example, p-type GaN, and heat treatment may be performed to activate impurities.

Figure 4:
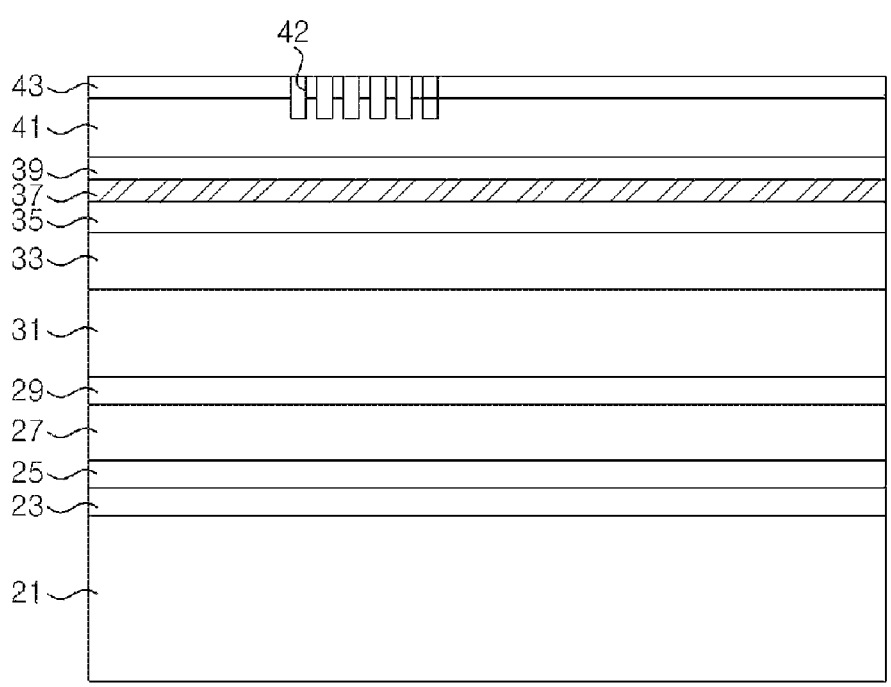

Referring to FIG. 4, column-shaped nano patterns 42 are formed by partially etching the second conductive-type clad layer 41 and the second conductive-type contact layer 43. The nano patterns 42, which have a dimension of below 1 μm, may be formed by a nano lithography technique, e.g., a nano imprint technique. Before the second conductive-type clad layer 41 and the second conductive-type contact layer 43 are etched by the nano lithography technique, a mask layer, e.g., $SiO_2$ layer may be formed on the second conductive-type contact layer 43.

The nano patterns 42 may not reflect light if the height thereof is too small. However, the active layer 37 may be exposed if the height of the nano patterns 42 is too large. Therefore, the nano patterns 42 are formed by partially etching the second conductive-type clad layer 41 so that the active layer 37 is not exposed. The nano patterns 42 are formed to have a height so that light can be reflected.

In addition, the nano patterns 42 may be protruding columns, but may be recessed portions. The nano patterns 42 may be arranged at roughly the same interval.

Figure 5:
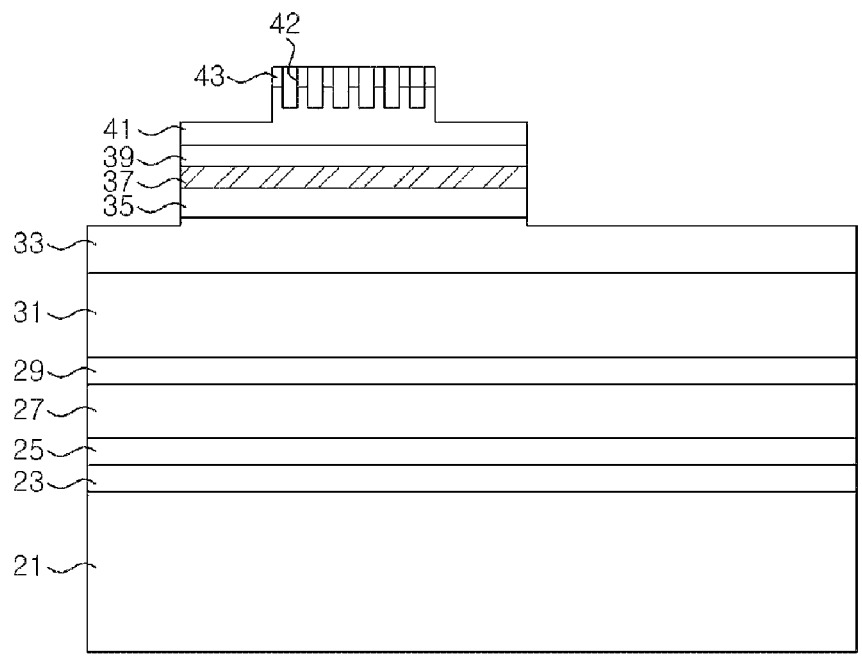

Referring to FIG. 5, a mesa is formed by sequentially etching the second conductive-type contact layer 43, the second conductive-type clad layer 41, the carrier blocking layer 39, the active layer 37, and the first conductive-type clad layer 35 by a photolithography and etching technique, and a portion of the first contact layer 33 is then exposed.

A ridge positioned at an upper portion of the mesa is formed by etching the second conductive-type contact layer 43 and the second conductive-type clad layer 41. The second conductive-type clad layer 41 may be partially etched, thereby preventing a top surface of the active layer 37 from being exposed. The process of forming the ridge and the mesa is performed so that the nano patterns 42 remain on the surface of the ridge. As the height of the ridge is relatively larger than that of the nano patterns 42, a refractive index difference between the ridge and its periphery can be increased.

Figure 6:
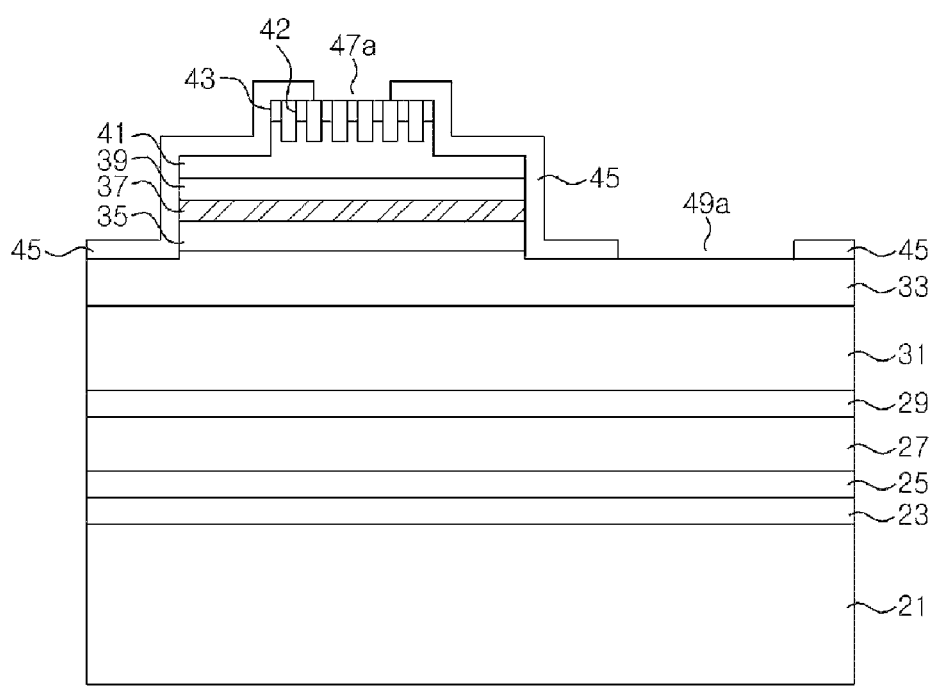

Referring to FIG. 6, an insulating layer 45 is formed on top of the substrate 21 having the ridge and mesa formed thereon and then patterned, thereby forming an opening 47a that exposes the ridge and an opening 49a that exposes the first conductive-type contact layer 33. The openings 47a and 49a may be formed by patterning the insulating layer 45 by a photolithography and etching technique.

Subsequently, first and second electrodes 49 and 47 (see FIG. 1) are formed to cover the openings 49a and 47a, respectively. For example, the first electrode 49 may be formed of Ti/Al, and the second electrode 47 may be formed of Ni/Au. The first and second electrodes 49 and 47 may be formed by a lift-off process. Accordingly, the laser diode of FIG. 1 and FIG. 2 is formed.

According to this embodiment, column-shaped nano patterns 42 may be formed using a nano imprint technique, and such nano patterns may be formed to be arranged at a dense interval.

Although it has been described in this embodiment that the first conductive-type clad layer 35 is formed on the first conductive-type contact layer 33, the first conductive-type contact layer 33 may be omitted. In this case, a portion of the first conductive-type clad layer 35 may be exposed while the mesa is formed, and the first electrode 49 may be formed on the exposed first conductive-type clad layer 35.

Experimental Example

Figure 7:
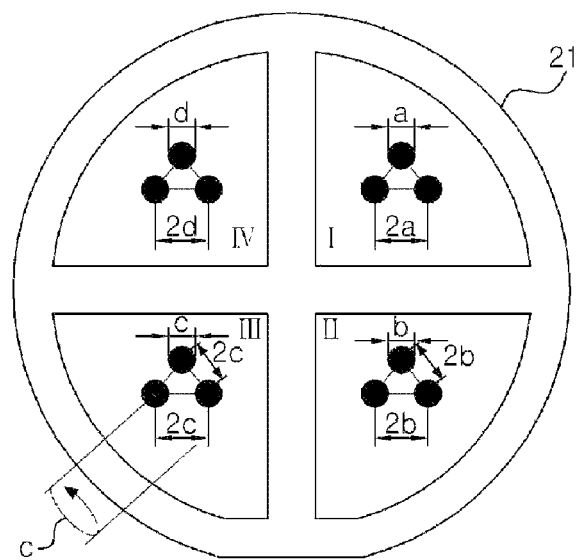
FIG. 7 is a schematic plan view illustrating samples fabricated according to an embodiment of the present invention.

FIG. 7 is a schematic plan view illustrating samples fabricated according to an embodiment of the present invention.

Referring to FIG. 3 and FIG. 7, a two-inch sapphire substrate 21 was first annealed at 1150° C. for 10 minutes, and an SiN buffer layer 23 was then formed at 500° C. using $SiH_4$ and ammonia. Thereafter, a GaN buffer layer 25 was formed to a thickness of 20 nm, and an undoped GaN layer 27 was grown to a thickness of 3 μm at 1050° C. Subsequently, a SiN defect prevention layer 29 was grown, and an undoped GaN layer 31 was grown to a thickness of 3 μm. A first conductive-type contact layer 33 was grown on the undoped GaN layer 31 to a thickness of 2 μm using n-type GaN, and n-type $Al_{0.1}Ga_{0.9}N$ of a thickness of 2 nm and n-type GaN of a thickness of 2 nm were repeatedly formed 150 times, thereby forming a first conductive-type clad layer 35. Thereafter, $In_{0.05}Ga_{0.95}N$ of a thickness of 2 nm and GaN of a thickness of 10 nm were repeatedly formed five times at 700° C., thereby forming an active layer 37 of a multiple quantum well structure. Subsequently, a carrier blocking layer 39 of p-type $Al_{0.3}Ga_{0.7}N$ was grown to a thickness of 20 nm at 1020° C., and p-type $Al_{0.15}Ga_{0.85}N$ of a thickness of 2 nm and GaN of a thickness of 2 nm were repeatedly grown 150 times, thereby forming a second conductive-type clad layer 41. Then, a second conductive-type contact layer 43 of p-type GaN was formed to a thickness of 20 nm on the second conductive-type clad layer 41. Thereafter, the substrate was heat-treated at 700° C. for ten minutes to activate p-type impurities.

Referring to FIG. 4 and FIG. 7, an $SiO_2$ layer was formed to a thickness of 50 nm on the second conductive-type contact layer 43. Then, the substrate was divided into four regions as shown in FIG. 7, and a mask was formed so that circular columns were formed in each region to have a diameter a of 100 nm in region I, a diameter b of 150 nm in region II, a diameter c of 200 nm in region III, and a diameter d of 250 nm in region IV at the same interval as the diameter of the circular columns in each region. The mask was formed using a nano imprint technique. Thereafter, the $SiO_2$ layer was etched by performing reactive ion etching (RIE) for 2 minutes using $CF_4$, and the GaN or AlGaN/GaN layer was then etched at 100 W for 8 minutes using $BCl_3$. Then, the mask was removed by performing RIE using $O_2$, and the $SiO_2$ layer was removed by performing RIE using $CF_4$ (also, the layer can be removed by using HF). Thus, nano patterns 42 having a height of 300 nm were formed with AFM.

Referring to FIG. 5 and FIG. 7, a mesa was formed by performing an etching process to a depth of 2 μm using a photolithography and etching technique so that a width of 100 μm (W1 in FIG. 1) remained in each region. The etching was performed using $BCl_3+Cl_2$. In addition, a ridge was formed by performing 600 nm etching so that a width of 50 μm remained.

Referring to FIG. 6 and FIG. 7, an $SiO_2$ insulating layer 45 was formed to a thickness of 100 nm, and openings 47a and 49a were formed. The opening 47a was formed to have a width of 2 μm. Subsequently, as shown in FIG. 2, a first electrode 49 and a second electrode 47 were formed of Ti/Au and Ni/Au to thicknesses of 50 nm and 10 nm, respectively, by a lift-off technique. Au having a thickness of 1 μm was deposited on each of the first and second electrodes 49 and 47. The first electrode 49 was formed to a width of 100 μm, and the second electrode 47 was formed to a width of 50 μm.

Subsequently, the respective samples were separated from the substrate 21 by cleaving the substrate 21. In this case, the cleaving was performed in parallel with a cutting axis C of FIG. 7 so that one side of a regular triangle of the nano patterns was parallel with a cleavage plane of the substrate. Thus, the length of each side of the rectangular triangle is two times greater than the diameter of the nano patterns, and the distance between adjacent parallel two sides of the rectangular triangles is 1.73 times greater than the diameter of the nano patterns. Thus, the samples obtained from the respective regions of FIG. 7 were arranged at periods of 173 nm, 260 nm, 346 nm, and 433 nm, each of which was a resonator length. Therefore, each sample became a laser diode in which cleavage mirrors and Bragg reflectors coexisted.

Meanwhile, as a reference sample for the samples, a sample was fabricated in the same manner as the aforementioned samples using one region of the substrate 21 except the nano patterns. The respective samples were fabricated with different lengths L in a range of 300 μm to 1 mm.

A pulse current having a pulse time of 1 ms and a pulse width of 100 ns was applied to the samples. The samples having length L of 600 μm were all oscillated. The threshold currents and threshold voltages of the samples at 20° C. are shown in FIGS. 8 and 9, respectively.

Figure 8:
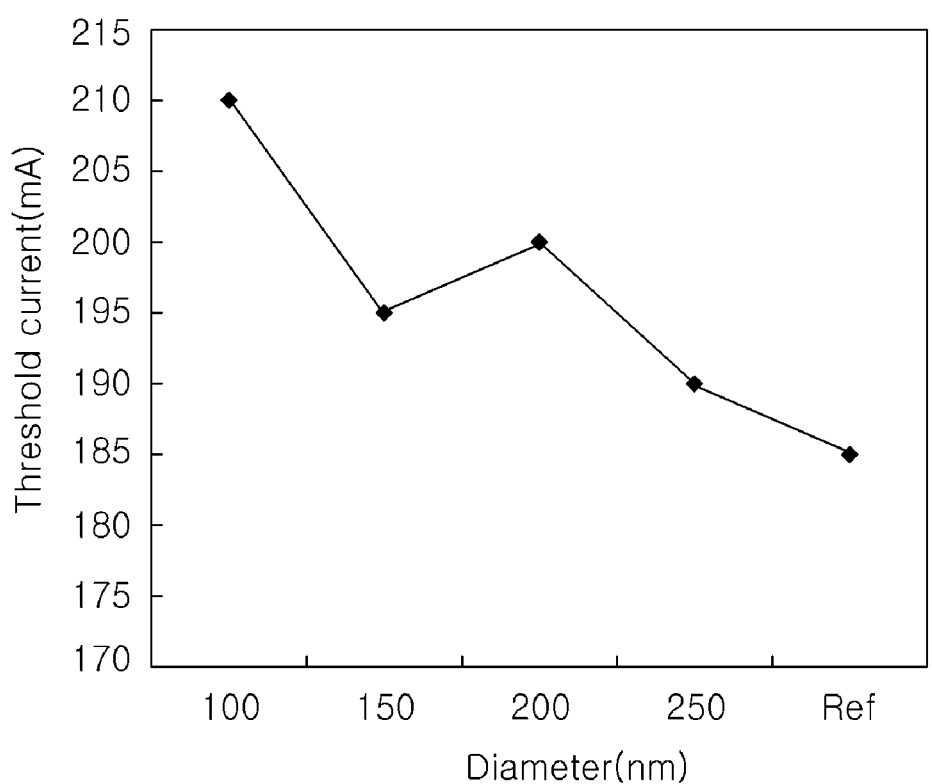
FIG. 8 and FIG. 9 are graphs respectively showing threshold pulse current and threshold voltage measured at 20° C. of various samples, each of which has a laser length L of 600 μm.
Figure 9:
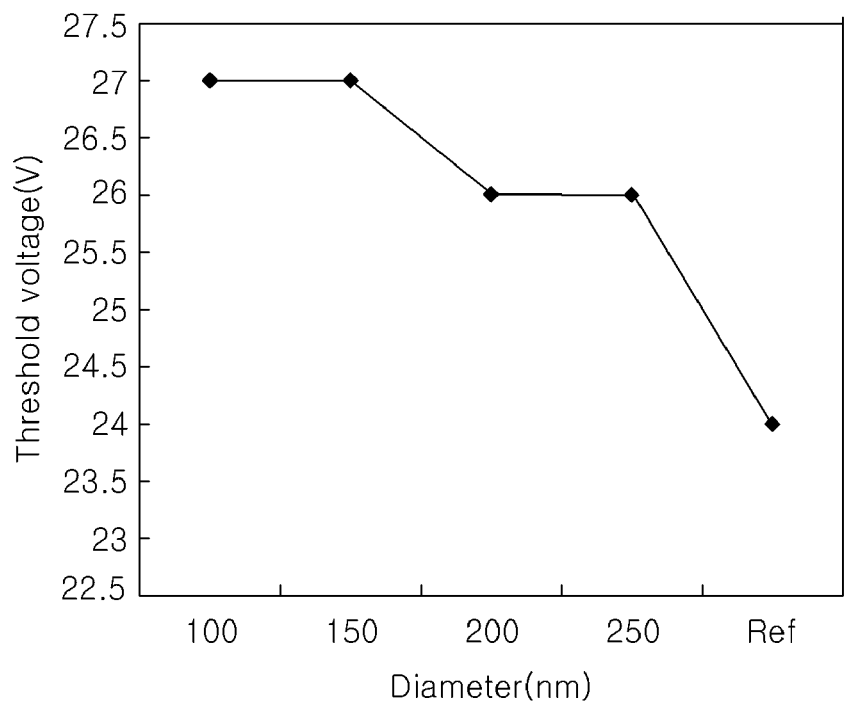

Referring to FIG. 8 and FIG. 9, the sample having the nano patterns with a diameter of 200 nm had a threshold current of 200 mA and a threshold voltage of 26 V. The reference sample having a length of 600 μm had a threshold current of 185 mA and a threshold voltage of 24 V. The wavelength of these samples was 401 nm.

The samples having length L below 400 μm or over 800 μm were not oscillated. This is because the threshold voltages of these samples exceeded 30 V although the maximum voltage of a pulse transmitter is 30 V.

Figure 10:
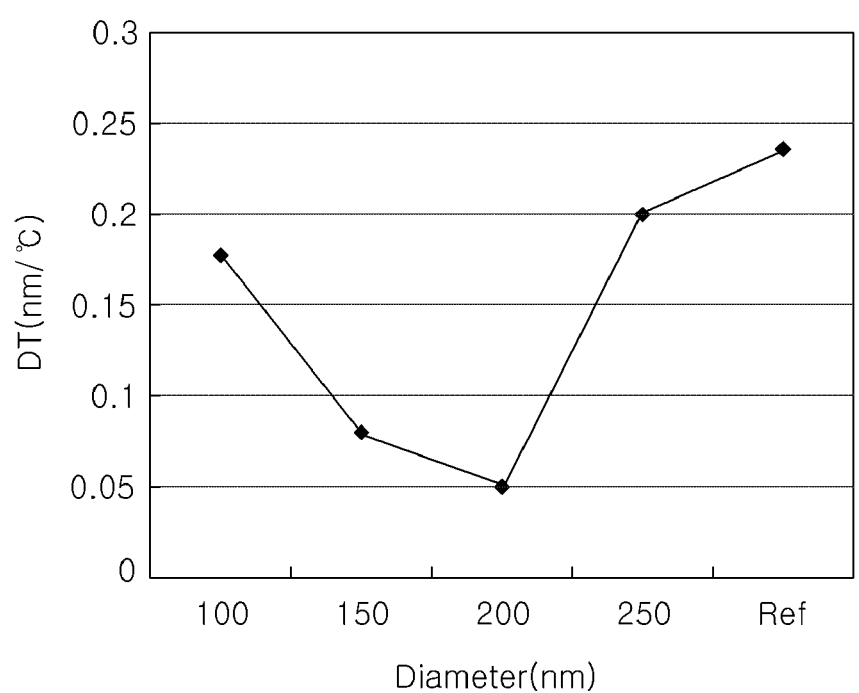
FIG. 10 is a graph showing a wavelength increase of various samples, each of which has a laser length L of 600 μm, depending on a temperature.

Then, light emitting spectra were measured by changing a temperature from 20 to 80° C. FIG. 10 shows a wavelength change of samples having a length of 600 μm depending on a temperature. A considerably large number of light emitting spectra of the samples according to the embodiment of the present invention appeared in the vicinity of a threshold, but became a single mode at 1.1 times of the threshold. On the contrary, in the reference sample, light emitting spectra did not become a single mode at about 1.1 times of the threshold, and three to ten wavelengths appeared. Thus, in case of the reference sample, the wavelength showing the maximum intensity was selected as a peak wavelength. The spectra were measured using a spectroscope with a resolution of 0.02 nm.

Referring to FIG. 10, a wavelength increase depending on temperature was 0.05 nm/° C. for the sample having the nano patterns with a diameter of 200 nm, and 0.24 nm/° C. in case of the reference sample. The wavelength increases of all the samples depending on temperature were less than that of the reference sample.

The sample having a resonator length closest to $2\lambda/n$ has the smallest wavelength increase (308 nm≈346 nm). However, in case of the sample having the nano patterns of a=100 nm, the length of a resonator is 173 nm, and the distance between desired periodic patterns is 154 nm, which is the same degree as the aforementioned sample. Here, the wavelength increase of the sample depending on temperature was considerably large. It is estimated that the samples of a=100 nm were not precisely formed to have a diameter and an interval of 100 nm.

According to the embodiments of the present invention, a laser diode having column-shaped nano patterns periodically arranged therein is provided. Particularly, the nano patterns can be periodically arranged at a fine pitch, whereby a single mode laser with a short wavelength, for example, in a range of 400 nm can be implemented. Further, an angle made by the periodic arrangement of the nano patterns and a cleavage plane is adjusted, so that a laser wavelength can be controlled.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A laser diode, comprising:
a substrate;
a first conductive-type clad layer disposed on the substrate;
a second conductive-type clad layer disposed on the first conductive-type clad layer;
an active layer interposed between the first conductive-type clad layer and the second conductive-type clad layer; and
column-shaped nano patterns arranged at a surface of the second conductive-type clad layer,
wherein the nano patterns are protruding columns including the second conductive-type clad layer or are recessed portions surrounded by the second conductive-type clad layer on at least two adjacent sides of each nano pattern,
wherein the respective nano patterns are formed in a circular-column shape having a diameter,
wherein the nano patterns are spaced apart from one another at an interval equal to the diameter, and
wherein cleavage mirrors are respectively formed at both opposite side surfaces of the laser diode, and each cleavage mirror is parallel with any one side of a regular triangle defined by three adjacent nano patterns.

2. The laser diode as claimed in claim 1, wherein the nano patterns are formed by partially etching the second conductive-type clad layer.

3. The laser diode as claimed in claim 1, wherein the diameter is 100 nm to 250 nm.

4. A laser diode, comprising:
a substrate;
a first conductive-type clad layer disposed on the substrate;
a second conductive-type clad layer disposed on the first conductive-type clad layer;
an active layer interposed between the first conductive-type clad layer and the second conductive-type clad layer; and
column-shaped nano patterns arranged at a surface of the second conductive-type clad layer,
wherein the nano patterns are protruding columns including the second conductive-type clad layer or are recessed portions surrounded by the second conductive-type clad layer on at least two adjacent sides of each nano pattern,
wherein the respective nano patterns are formed in a circular-column shape having a diameter,
wherein the nano patterns are spaced apart from one another at an interval equal to the diameter, and
wherein cleavage mirrors are respectively formed at both opposite side surfaces of the laser diode, and each cleavage mirror makes an angle of intersection with all sides of a regular triangle defined by three adjacent nano patterns.

5. The laser diode as claimed in claim 1, wherein the nano patterns are formed in a protruding column shape, and a second conductive-type contact layer is disposed on an upper side of the nano patterns.

6. The laser diode as claimed in claim 1, further comprising a second conductive-type contact layer disposed on the second conductive-type clad layer, wherein the nano patterns are recessed portions disposed in the second conductive-type clad layer through the second conductive-type contact layer.

7. The laser diode as claimed in claim 1, wherein the laser diode is one of a distributed feedback laser diode, a distributed Bragg reflector laser diode, and a Bragg reflector laser diode.

8. A method for fabricating a laser diode, comprising:
forming semiconductor layers with a laminated structure comprising a first conductive-type clad layer, an active layer, and a second conductive-type clad layer on a substrate; and
forming column-shaped nano patterns spaced apart from one another by partially etching the second conductive-type clad layer,
wherein the nano patterns are protruding columns including the second conductive-type clad layer or are recessed portions surrounded by the second conductive-type clad layer on at least two adjacent sides of each nano pattern,
wherein the nano patterns are arranged so that three adjacent nano patterns define a regular triangle, and
wherein cleavage mirrors are respectively formed at both opposite side surfaces of the laser diode by cleaving the substrate, and the cleavage mirrors are parallel with any one side c a regular triangle defined by three adjacent nano patterns.

9. The method as claimed in claim 8, wherein the nano patterns are formed using a nano imprint technique.

10. The method as claimed in claim 8, further comprising:
forming a second conductive-type contact layer on the second conductive-type clad layer.

11. A method for fabricating a laser diode, comprising:
forming semiconductor layers with a laminated structure comprising a first conductive-type clad layer, an active layer, and a second conductive-type clad layer on a substrate; and
forming column-shaped nano patterns spaced apart from one another by partially etching the second conductive-type clad layer,
wherein the nano patterns are protruding columns including the second conductive-type clad layer or are recessed portions surrounded by the second conductive-type clad layer on at least two adjacent sides of each nano pattern,
wherein the nano patterns are arranged so that three adjacent nano patterns define a regular triangle, and
wherein cleavage mirrors are respectively formed at both opposite side surfaces of the laser diode by cleaving the substrate, and the cleavage mirrors make an angle of intersection with all sides of a regular triangle defined by three adjacent nano patterns.

12. A laser diode, comprising:
a substrate;
a first conductive-type clad layer disposed on the substrate;
a second conductive-type clad layer disposed on the first conductive-type clad layer;
an active layer interposed between the first conductive-type clad layer and the second conductive-type clad layer; and
column-shaped nano patterns arranged at a surface of the second conductive-type clad layer,
wherein cleavage mirrors are respectively formed at both opposite side surfaces of the laser diode, and
wherein each cleavage mirror is parallel with any one side of a regular triangle defined by three adjacent nano patterns, or each cleavage mirror makes an angle of intersection with all sides of the regular triangle defined by the three adjacent nano patterns.

13. The laser diode as claimed in claim 4, wherein the nano patterns are formed by partially etching the second conductive-type clad layer.

14. The laser diode as claimed in claim 4, wherein the diameter is 100 nm to 250 nm.

15. The laser diode as claimed in claim 4, wherein the nano patterns are formed in a protruding column shape, and a second conductive-type contact layer is disposed on an upper side of the nano patterns.

16. The laser diode as claimed in claim 4, further comprising a second conductive-type contact layer disposed on the second conductive-type clad layer, wherein the nano patterns are recessed portions disposed in the second conductive-type clad layer through the second conductive-type contact layer.

17. The laser diode as claimed in claim 4, wherein the laser diode is one of a distributed feedback laser diode, a distributed Bragg reflector laser diode, and a Bragg reflector laser diode.

18. The method as claimed in claim 11, wherein the nano patterns are formed using a nano imprint technique.

19. The method as claimed in claim 11, further comprising:
forming a second conductive-type contact layer on the second conductive-type clad layer.

* * * * *